(12) United States Patent
Lin et al.

(10) Patent No.: US 12,489,046 B2
(45) Date of Patent: Dec. 2, 2025

(54) ELECTRONIC DEVICE WITH IMPROVED ELECTRICIAL PROPERTY

(71) Applicant: InnoLux Corporation, Miao-Li County (TW)

(72) Inventors: Yi-Hung Lin, Miao-Li County (TW); Chun-Hung Lai, Miao-Li County (TW); Chun-Chin Fan, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 599 days.

(21) Appl. No.: 17/749,016

(22) Filed: May 19, 2022

(65) Prior Publication Data

US 2023/0145304 A1    May 11, 2023

(30) Foreign Application Priority Data

Nov. 8, 2021 (CN) .......................... 202111316706.5

(51) Int. Cl.
*H01L 23/498* (2006.01)
*H01L 21/48* (2006.01)
(Continued)

(52) U.S. Cl.
CPC .... *H01L 23/49838* (2013.01); *H01L 21/4853* (2013.01); *H01L 21/4857* (2013.01); *H01L 23/49822* (2013.01); *H01L 24/13* (2013.01); *H01L 21/6835* (2013.01); *H01L 24/11* (2013.01); *H01L 24/16* (2013.01); *H01L 2221/68345* (2013.01); *H01L 2224/1182* (2013.01); *H01L 2224/13021* (2013.01); *H01L 2224/13118* (2013.01); *H01L 2224/13124* (2013.01); *H01L 2224/13139* (2013.01); *H01L 2224/13144* (2013.01); *H01L 2224/13147* (2013.01); *H01L 2224/13149* (2013.01); *H01L 2224/13155* (2013.01);
(Continued)

(58) Field of Classification Search
CPC ........... H01L 21/4857; H01L 23/49822; H01L 21/4853; H01L 24/13; H01L 2224/13021
See application file for complete search history.

(56) References Cited

U.S. PATENT DOCUMENTS

2017/0103946 A1*  4/2017  Chang ................. H01L 23/5223
2019/0115294 A1*  4/2019  Lu ........................... H01L 24/16
(Continued)

FOREIGN PATENT DOCUMENTS

CN    102214616 A    10/2011
CN    102263067 A    11/2011
(Continued)

*Primary Examiner* — Eliseo Ramos Feliciano
*Assistant Examiner* — Mikka Liu
(74) *Attorney, Agent, or Firm* — MUNCY, GEISSLER, OLDS & LOWE, P.C.

(57) ABSTRACT

An electronic device and a method for manufacturing the same are provided. The electronic device includes: a first insulating layer; a first metal bump disposed on the first insulating layer; and a second insulating layer disposed on the first metal bump, wherein the second insulating layer includes a first opening exposing a portion of the first metal bump, wherein a thickness of the first insulating layer is greater than a thickness of the second insulating layer.

17 Claims, 9 Drawing Sheets

(51) Int. Cl.
*H01L 23/00* (2006.01)
*H01L 21/683* (2006.01)

(52) U.S. Cl.
CPC .............. *H01L 2224/13157* (2013.01); *H01L 2224/13164* (2013.01); *H01L 2224/13166* (2013.01); *H01L 2224/13169* (2013.01); *H01L 2224/13176* (2013.01); *H01L 2224/1318* (2013.01); *H01L 2224/13564* (2013.01); *H01L 2224/13565* (2013.01); *H01L 2224/13578* (2013.01); *H01L 2224/13644* (2013.01); *H01L 2224/13655* (2013.01); *H01L 2224/1369* (2013.01); *H01L 2224/16238* (2013.01)

(56) References Cited

U.S. PATENT DOCUMENTS

2019/0348352 A1* 11/2019 Huang ................. H01L 21/486
2020/0058626 A1* 2/2020 Tai .................... H01L 23/49811

FOREIGN PATENT DOCUMENTS

| | | |
|---|---|---|
| CN | 106328618 B | 12/2018 |
| TW | 201142997 A | 12/2011 |
| TW | 201145482 A | 12/2011 |
| TW | I682692 B | 1/2020 |

* cited by examiner

ELECTRONIC DEVICE WITH IMPROVED ELECTRICIAL PROPERTY

CROSS REFERENCE TO RELATED APPLICATION

This application claims the benefits of the Chinese Patent Application Ser. No. 202111316706.5, filed on Nov. 8, 2021, the subject matter of which is incorporated herein by reference.

BACKGROUND

1. Field

The present disclosure relates to an electronic device and a method for manufacturing the same. More specifically, the present disclosure relates to an electronic device in which the influence caused by roughness can be improved and a method for manufacturing the same.

2. Description of Related Art

With the development of technology and in response to consumer demand, most electronic products today are developing towards a high degree of integration, that is, a single electronic device can have multiple functions. Electronic products with more functions will require more chips, and the design of input/output (I/O) circuits will be more complicated. Generally, a re-distribution layer can be used to change the original design of the I/O circuit, or to increase the spacing or quantity of the I/O to meet the requirements.

However, with the increase of the process steps, the surface roughness of the metal layer in the circuit also increases, thereby affecting the electrical property of the electronic device. Therefore, it is desirable to provide an electronic device and a method for manufacturing the same to improve the conventional defects.

SUMMARY

The present disclosure provides an electronic device, which comprises: a first insulating layer; a first metal bump disposed on the first insulating layer; and a second insulating layer disposed on the first metal bump, wherein the second insulating layer comprises a first opening exposing a portion of the first metal bump, wherein a thickness of the first insulating layer is greater than a thickness of the second insulating layer.

The present disclosure also provides a method for manufacturing an electronic device, which comprises the following steps: providing a substrate; forming a first insulating layer on the substrate; forming a first metal bump on the first insulating layer; and forming a second insulating layer on the first metal bump, wherein the second insulating layer comprises a first opening exposing a portion of the first metal bump, wherein a thickness of the first insulating layer is greater than a thickness of the second insulating layer.

Other novel features of the disclosure will become more apparent from the following detailed description when taken in conjunction with the accompanying drawings.

DETAILED DESCRIPTION OF EMBODIMENT

The following is specific embodiments to illustrate the implementation of the present disclosure. Those who are familiar with this technique can easily understand the other advantages and effects of the present disclosure from the content disclosed in the present specification. The present disclosure can also be implemented or applied by other different specific embodiments, and various details in the present specification can also be modified and changed according to different viewpoints and applications without departing from the spirit of the present disclosure.

It should be noted that, in the present specification, when a component is described to have an element, it means that the component may have one or more of the elements, and it does not mean that the component has only one of the element, except otherwise specified. Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

In the specification and the appended claims of the present disclosure, certain words are used to refer to specific elements. Those skilled in the art should understand that electronic device manufacturers may refer to the same components by different names. The present specification does not intend to distinguish between elements that have the same function but have different names.

In the following description and claims, words such as "comprising", "including", "containing", and "having" are open-ended words, so they should be interpreted as meaning "containing but not limited to . . . ".

Therefore, when the terms "comprising", "including", "containing" and/or "having" are used in the description of the present disclosure, they specify the existence of corresponding features, regions, steps, operations and/or components, but do not exclude the existence of one or more corresponding features, regions, steps, operations and/or components.

In the present disclosure, the terms "almost", "about" and "approximately" usually mean within 10%, within 5%, within 3%, within 2%, within 1%, or within 0.5% of a given value or range. The quantity given here is an approximate quantity, that is, without specifying "almost", "about" and "approximately", it can still imply "almost", "about" and "approximately". In addition, the terms "in a range from a first value to a second value" and "in a range between a first value and a second value" mean the said range comprises the first value, the second value and other values between the first value and the second value.

In the present specification, except otherwise specified, the terms (including technical and scientific terms) used herein have the meanings generally known by a person skilled in the art. It should be noted that, except otherwise specified in the embodiments of the present disclosure, these terms (for example, the terms defined in the generally used dictionary) should have the meanings identical to those known in the art, the background of the present disclosure or the context of the present specification, and should not be read by an ideal or over-formal way.

In addition, relative terms such as "below" or "under" and "on", "above" or "over" may be used in the embodiments to describe the relative relationship between one element and another element in the drawings. It will be understood that if the device in the drawing was turned upside down, elements described on the "lower" side would then become elements described on the "upper" side. When a unit (for example, a layer or a region) is referred to as being "on" another unit, it can be directly on the another unit or there may be other units therebetween. Furthermore, when a unit is said to be "directly on another unit", there is no unit therebetween. Moreover, when a unit is said to be "on another unit", the two have a top-down relationship in a top view, and the unit can be disposed above or below the another unit, and the top-bottom relationship depends on the orientation of the device.

In the present disclosure, the measurement of thickness, length and width may be achieved by using an optical microscope, and the thickness may be measured by a cross-sectional image in an electron microscope; but the present disclosure is not limited thereto. In addition, any two values or directions used for comparison may have certain errors. If the first value is equal to the second value, it implies that there may be an error of about 10% between the first value and the second value. If the first direction is perpendicular to the second direction, the angle between the first direction and the second direction may be between 80° and 100°. If the first direction is parallel to the second direction, the angle between the first direction and the second direction may be between 0° and 10°.

It should be noted that the technical solutions provided by different embodiments hereinafter may be replaced, combined or used in combination, so as to constitute another embodiment without violating the spirit of the present disclosure.

Figure 1A:
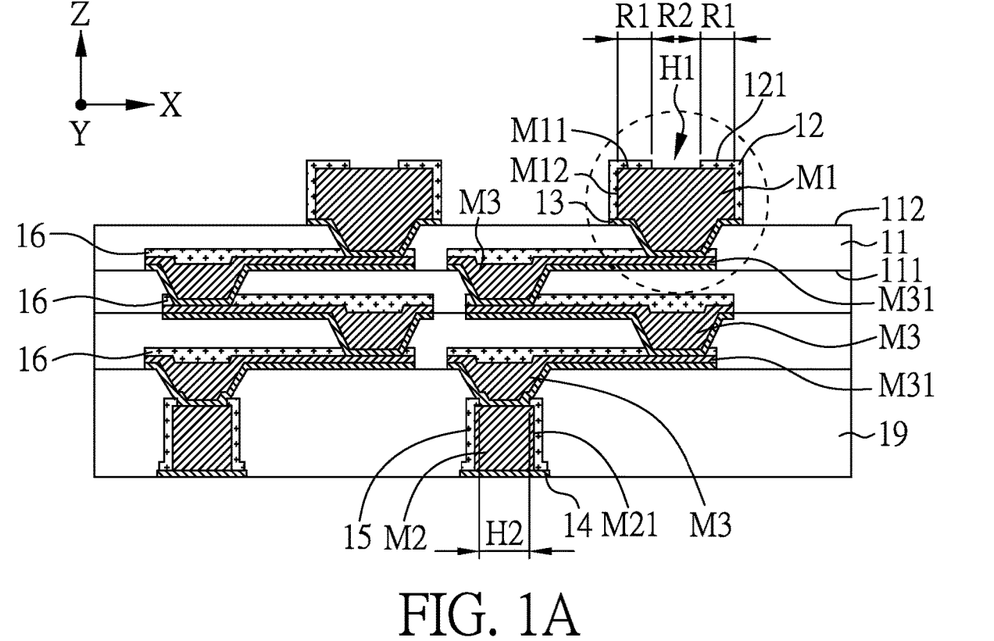
FIG. 1A is a schematic cross-sectional view of an electronic device according to one embodiment of the present disclosure.
Figure 1B:
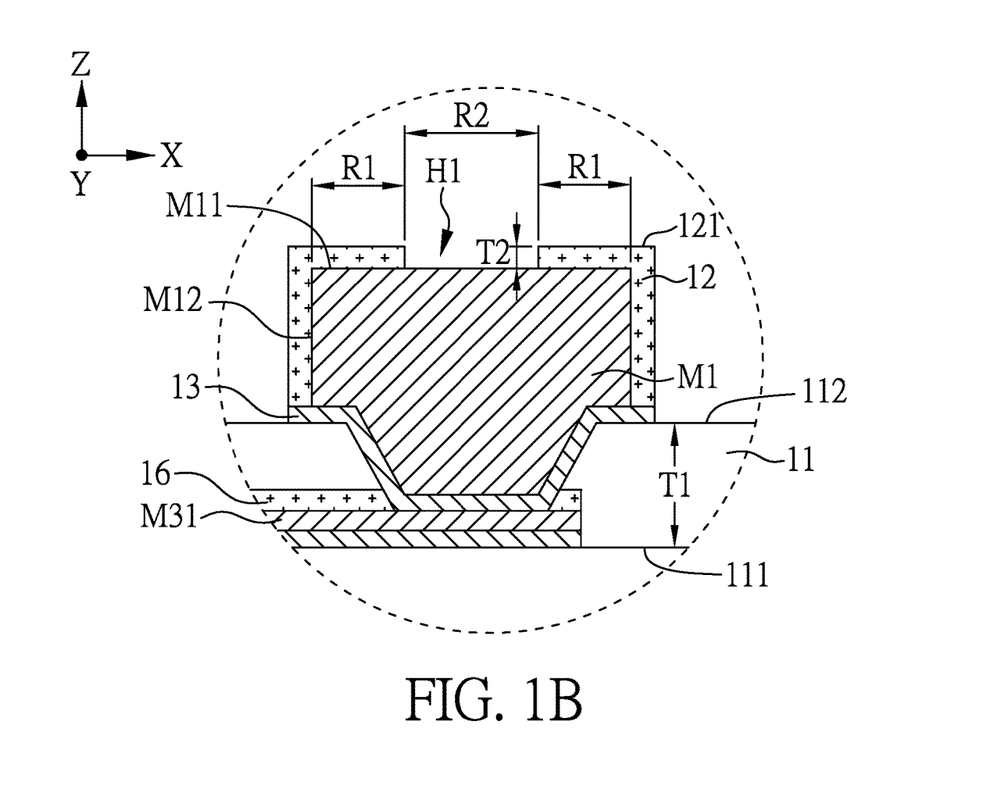
FIG. 1B is a partial enlarged view of FIG. 1A.

FIG. 1A is a schematic cross-sectional view of an electronic device according to one embodiment of the present disclosure. FIG. 1B is a partial enlarged view of FIG. 1A.

As shown in FIG. 1A and FIG. 1B, the electronic device of the present disclosure comprises: a first insulating layer 11; a first metal bump M1 disposed on the first insulating layer 11; and a second insulating layer 12 disposed on the first metal bump M1, wherein the second insulating layer 12 comprises a first opening H1 exposing a portion of the first metal bump M1, wherein a thickness T1 of the first insulating layer 11 is greater than a thickness T2 of the second insulating layer 12.

More specifically, as shown in FIG. 1B, in the normal direction Z of the electronic device, the second insulating layer 12 covers part of the first metal bump M1. Thus, in the subsequent process, the second insulating layer 12 can be used to protect the first metal bump M1 (for example, the second insulating layer 12 may have the effect of anti-scratch and/or acid and alkali-resistance) to reduce the damage on the surface of the first metal bump M1, and thereby the electrical property of the electronic device can be improved. In one embodiment of the present disclosure, in the normal direction Z of the electronic device, the second insulating layer 12 and the first metal bump M1 may be partially overlapped. In one embodiment of the present disclosure, the second insulating layer 12 may partially cover a surface M11 and/or a side wall M12 of the first metal bump M1 to improve the reliability of the electronic device. In one embodiment of the present disclosure, the second insulating layer 12 may directly contact the surface M11 and/or the side wall M12 of the first metal bump M1 to protect the first metal bump M1; but the present disclosure is not limited thereto. In one embodiment of the present disclosure, the first metal bump M1 comprises a first region R1 and a second region R2, wherein the second insulating layer 12 is disposed corresponding to the first region R1, and the first opening H1 corresponds to the second region R2. More specifically, in the normal direction Z of the electronic device, the first region R1 and the second insulating layer 12 may be overlapped, and the second region R2 and the second insulating layer 12 are not overlapped, wherein a surface roughness of the second region R2 is different from a surface roughness of the first region R1. In one aspect of the present disclosure, the surface roughness of the second region R2 may be greater than the surface roughness of the first region R1.

In addition, as shown in FIG. 1A and FIG. 1B, the electronic device of the present disclosure may further comprise a first metal layer 13 disposed between the first insulating layer 11 and the first metal bump M1, and the first metal layer 13 electrically connects to the first metal bump M1. In one embodiment of the present disclosure, the first metal layer 13 may directly contact the first metal bump M1. In one embodiment of the present disclosure, the first metal layer 13 may directly contact the second insulating layer 12.

Figure 1C:
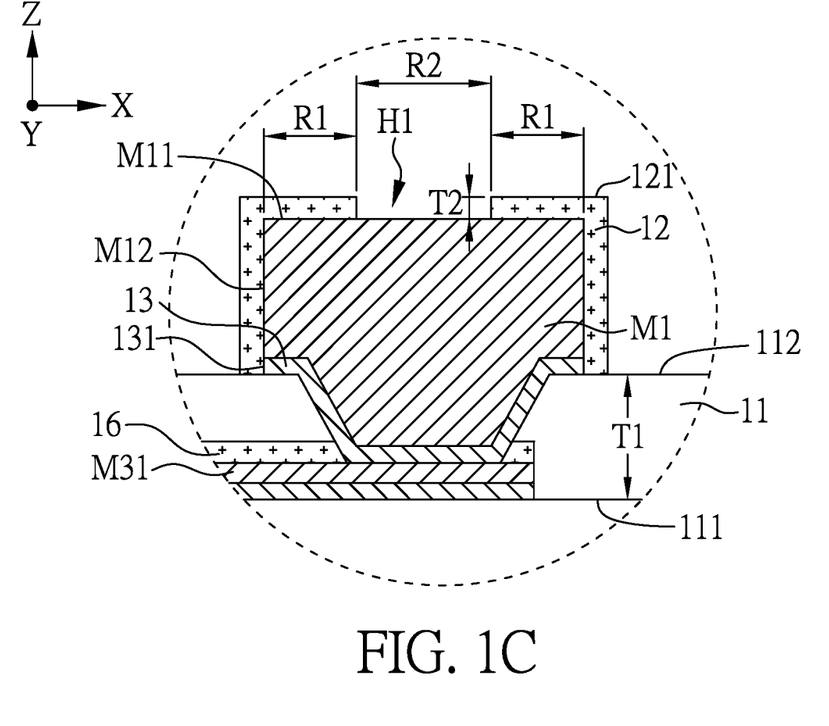
FIG. 1C is a partial enlarged view of FIG. 1A in another aspect.

FIG. 1C is a partial enlarged view of FIG. 1A in another aspect, wherein FIG. 1C is similar to FIG. 1B except for the following differences.

As shown in FIG. 1C, the second insulating layer 12 may directly contact the surface M11 and the side wall M12 of the first metal bump M1, and also directly contact a side wall 131 of the first metal layer 13 to reduce the contact between the external environment (such as air, moisture, chemicals, stress, etc.) and the first metal bump M1 as well as the first metal layer 13. Therefore, the effects of protecting the first metal bump M1 and protecting the first metal layer 13 can be achieved at the same time, and the electrical property of the electronic device can further be improved. In one aspect of the present disclosure, the second insulating layer 12 may directly contact the side wall 131 of the first metal layer 13.

In the present disclosure, the materials of the first insulating layer 11 and the second insulating layer 12 are not particularly limited, and may comprise, for example, an organic material, an inorganic material or a combination thereof. Examples of the suitable organic material may include polyimide (PI), photosensitive PI (PSPI), epoxy resin, polybenzoxazole (PBO), benzocyclobutene (ECB), photoresist, polymer or a combination thereof, but the present disclosure is not limited thereto. Examples of the suitable inorganic material may include silicon nitride, silicon oxide, silicon oxynitride, silicon carbonitride or a combination thereof, but the present disclosure is not limited thereto. In one embodiment of the present disclosure, the material of the first insulating layer 11 may be different from a material of the second insulating layer 12 to prevent the warpage of the obtained electronic device. In one embodiment of the present disclosure, the material of the first insulating layer 11 may include an organic material, and the material of the second insulating layer 12 may include an inorganic material; but the present disclosure is not limited thereto. In the present disclosure, the thickness T1 of the first insulating layer 11 may be, for example, greater than or equal to 5 µm and less than or equal to 25 µm, and the thickness T2 of the second insulating layer 12 may be, for example, greater than or equal to 0.5 µm and less than or equal to 5 µm; but the present disclosure is not limited thereto. In the present disclosure, the hardness of the second insulating layer 12 may be greater than the hardness of the first insulating layer 11 to provide a protective effect.

In the present disclosure, the materials of the first metal bump M1 and the first metal layer 13 are not particularly limited and may include, for example, gold (Au), silver (Ag), copper (Cu), palladium (Pd), platinum (Pt), ruthenium (Ru), aluminum (Al), cobalt (Co), nickel (Ni), titanium (Ti), molybdenum (Mo), manganese (Mn), zinc (Zn), an alloy thereof or a combination thereof; but the present disclosure is not limited thereto. In addition, the first metal bump M1 and the first metal layer 13 may be prepared by using the same or different materials. In one embodiment of the present disclosure, the first metal bump M1 may include Cu, and the first metal layer 13 may include Ti; but the present disclosure is not limited thereto. In addition, even not shown in the figure, in the present disclosure, the first metal layer 13 may be a composite layer, for example, a Ti/Cu or Ni/Cu composite layer; but the present disclosure is not limited thereto.

In the present disclosure, "the thickness T1 of the first insulating layer 11" refers to a maximum thickness from the bottom surface 111 of the first insulating layer 11 to the top surface 112 of the first insulating layer 11 in the normal direction Z of the electronic device. "The thickness T2 of the second insulating layer 12" may refer to the maximum thickness of the second insulating layer 12 where the second insulating layer 12 overlaps the first metal bump M1 in the normal direction Z of the electronic device; or "the thickness T2 of the second insulating layer 12" may refer to the maximum thickness of the second insulating layer 12 from the surface M11 of the first metal bump M1 to the surface 121 of the second insulating layer 12. In the present disclosure, the first insulating layer 11, the first metal bump M1 and the second insulating layer 12 are laminated along the normal direction Z of the electronic device.

In the present disclosure, as shown in FIG. 1A, the electronic device may further comprise: a third metal layer 14 disposed under the first insulating layer 11; a second metal bump M2 disposed on the third metal layer 14, wherein the second metal bump M2 electrically connects to the first metal bump M1; and a third insulating layer 15 disposed on the second metal bump M2, wherein the third insulating layer 15 comprises a second opening H2 exposing a portion of a surface of the second metal bump M2. Thus, the second metal bump M2 can electrically connect to the first metal bump M1 through the second opening H2 of the third insulating layer 15. In the normal direction Z of the electronic device, the third insulating layer 15 may cover a portion of the second metal bump M2. More specifically, the third insulating layer 15 and the second metal bump M2 may be partially overlapped. Thus, in the subsequent process, the third insulating layer 15 can be used to protect the second metal bump M2 to reduce the damage on the surface of the second metal bump M2, and thereby the electrical property of the electronic device can be improved. In addition, the third insulating layer 15 may cover the side wall M21 of the second metal bump M2 to improve the protective effect on the second metal bump M2 or improve the reliability of the obtained electronic device. In one aspect of the present disclosure, the third insulating layer 15 may directly contact the side wall M21 of the second metal bump M2, but the present disclosure is not limited thereto.

In the present disclosure, the material of the third metal layer 14 may be similar to the material of the first metal layer 13, the material of the second metal bump M2 may be similar to the material of the first metal bump M1, and the material of the third insulating layer 15 may be similar to the material of the second insulating layer 12. Thus, these materials are not described again. In one embodiment of the present disclosure, the second metal bump M2 may comprise Cu, and the third metal layer 14 may comprise Ti; but the present disclosure is not limited thereto. In addition, similar to the first metal layer 13, the third metal layer 14 may also be a composite layer, for example, a Ti/Cu or Ni/Cu composite layer; but the present disclosure is not limited thereto.

In the present disclosure, as shown in FIG. 1A, the electronic device may further comprise a plurality of third metal bumps M3 disposed between the first metal bump M1 and the second metal bump M2, and the first metal bump M1 may electrically connect to the second metal bump M2 through the plurality of third metal bumps M3. In the present disclosure, the electronic device may further comprise an extension portion M31 connecting to the third metal bump M3. The plurality of third metal bumps M3 may electrically connect to each other through the extension portion M31, and the second metal bump M2 may also electrically connect to the third metal bump M3 through the extension portion M31. Herein, an insulating layer 16 may be disposed on one of the plurality of third metal bumps M3 or on the extension portion M31 connecting to the one of the plurality of third metal bumps M3. The insulating layer 16 may directly contact the one of the plurality of third metal bumps M3 or the extension portion M31 connecting to the one of the plurality of third metal bumps M3, and partially cover the surface of the one of the plurality of third metal bumps M3 or the surface of the extension portion M31 connecting to the one of the plurality of third metal bumps M3. In the present embodiment, the insulating layer 16 may cover the surface of the third metal bump M3 and partially cover the surface of the extension portion M31 connecting to the third metal bump M3. Thus, the insulating layers 16 can be used to reduce the risk of damage to the surfaces of the plurality of third metal bumps M3.

Figure 2:
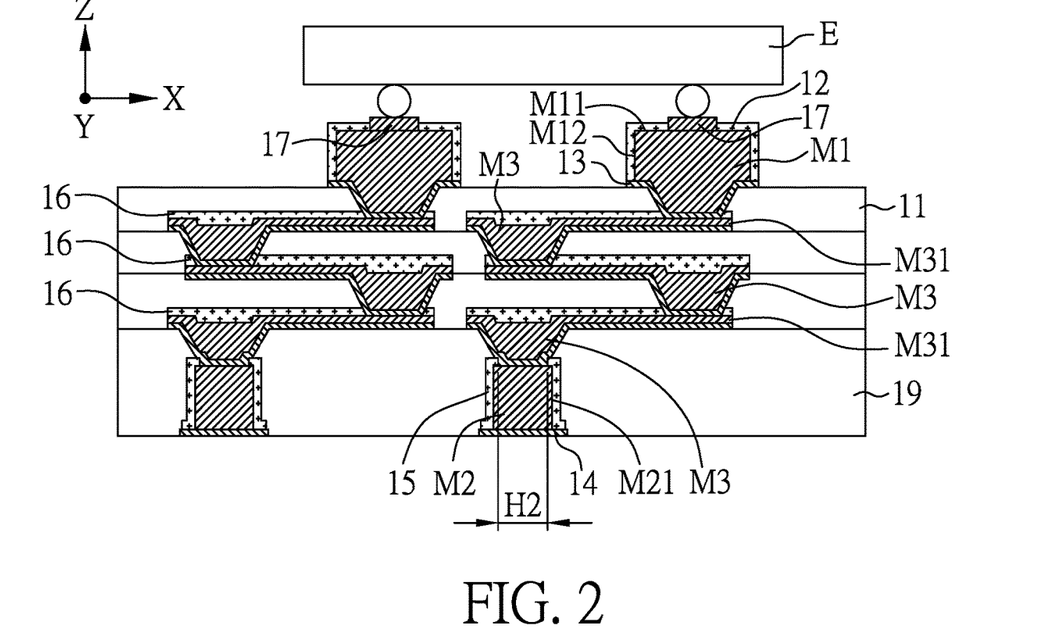
FIG. 2 is a schematic cross-sectional view of an electronic device according to one embodiment of the present disclosure.

FIG. 2 is a schematic cross-sectional view of an electronic device according to one embodiment of the present disclosure. The electronic device shown in FIG. 2 is similar to that shown in FIG. 1A, except for the following differences.

In one embodiment of the present disclosure, the electronic device may further comprise an electronic unit E disposed on the second insulating layer 12, wherein the electronic unit E electrically connects to the first metal bump M1. More specifically, the electronic unit E may electrically connect to the first metal bump M1 through the first opening H1 (as shown in FIG. 1A) of the second insulating layer 12. Herein, the electronic unit E may comprise a circuit board, an integrated circuit (IC), an active component, a passive component, etc., but the present disclosure is not limited thereto. In addition, the electronic device of the present disclosure may further comprise a second metal layer 17 disposed on the first metal bump M1 and in the first opening H1 of the second insulating layer 1. Thus, the electronic unit E may electrically connect to the first metal bump M1 through the second metal layer 17. In the present disclosure, the second metal layer 17 may comprise Ni, Au or a combination thereof, but the present disclosure is not limited thereto. In addition, similar to the first metal layer 13, the second metal layer 17 may also be a composite layer, for example, a Ni/Au composite layer; but the present disclosure is not limited thereto. In one embodiment of the present disclosure, the first metal bump M1 may be, for example, a contact pad electrically connecting to the electronic unit E, but the present is not limited thereto. More specifically, the electronic unit E may electrically connect to other elements (for example, a circuit board, a re-distribution layer, a passive component or other suitable elements) through the contact pad.

Figure 3:
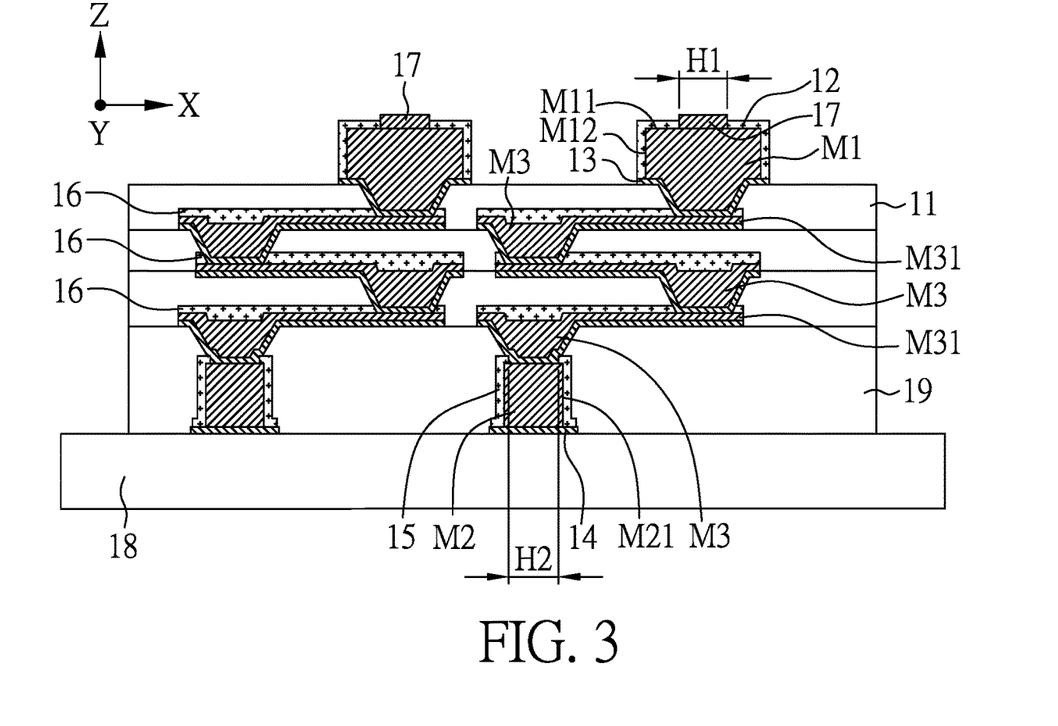
FIG. 3 is a schematic cross-sectional view of an electronic device according to one embodiment of the present disclosure.

FIG. 3 is a schematic cross-sectional view of an electronic device according to one embodiment of the present disclosure. The electronic device of FIG. 3 is similar to that shown in FIG. 1A, except for the following difference.

As shown in FIG. 3, in the present disclosure, the electronic device may further comprise a second metal layer 17 disposed on the first metal bump M1 and in the first opening H1 of the second insulating layer 12. Thus, the electronic unit (not shown in the figure) may electrically connect to the first metal bump M1 through the second metal layer 17. Herein, the material of the second metal layer 17 is similar to the material of the first metal layer 13 and is not described again. In one embodiment of the present disclosure, the second metal layer 17 may comprise Ni, Au or a combination thereof, but the present disclosure is not limited thereto. In the present disclosure, similar to the first metal layer 13, the second metal layer 17 may also be a composite layer, for example, a Ni/Au composite layer, but the present disclosure is not limited thereto.

In addition, in the present disclosure, the electronic device may further comprise a substrate 18 disposed under the first insulating layer 11. Herein, the substrate 18 may be a quartz substrate, a glass substrate, a wafer, a sapphire substrate, a flexible-rigid hybrid substrate or other rigid substrates; or the substrate 18 may be a flexible substrate or a film, and the material thereof may comprise polycarbonate (PC), polyimide (PI), polypropylene (PP), polyethylene terephthalate (PET), or other plastic materials; but the present disclosure is not limited thereto. Even not shown in the figure, in the present disclosure, the substrate 18 may further include an electronic component such as a circuit, a transistor, an active component or a passive component formed thereon. Thus, the substrate 18 of the present disclosure may be integrated with the electronic component formed thereon into a circuit board or an integrated circuit; but the present disclosure is not limited thereto.

Figure 4A:
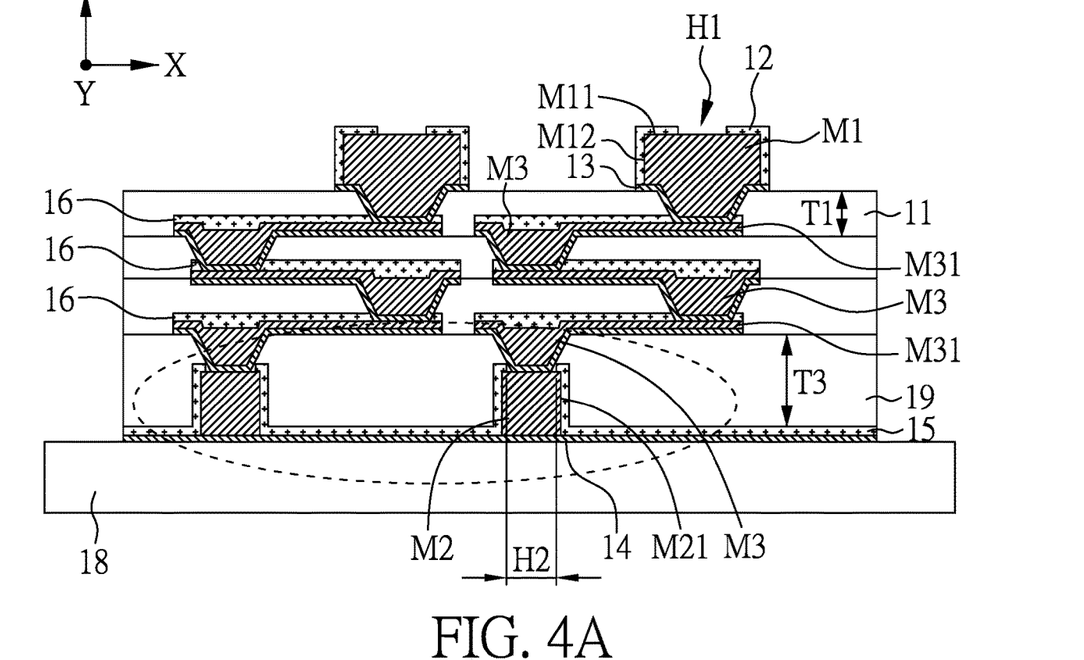
FIG. 4A is a schematic cross-sectional view of an electronic device according to one embodiment of the present disclosure.
Figure 4B:
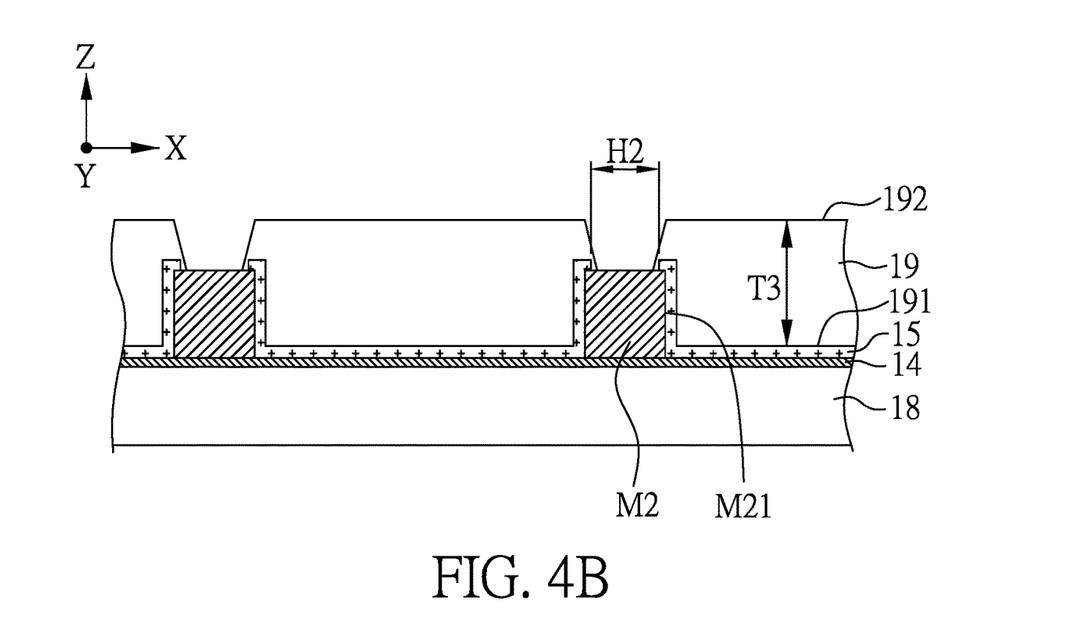
FIG. 4B is a partial enlarged view of FIG. 4A.

FIG. 4A is a schematic cross-sectional view of an electronic device according to one embodiment of the present disclosure. FIG. 4B is a partial enlarged view of FIG. 4A. Herein, the electronic shown in FIG. 4A is similar to that shown in FIG. 3, except for the following differences.

As shown in FIG. 4A and FIG. 4B, a third metal layer 14 is disposed on the substrate 18, wherein the third metal layer 14 extends along a first direction X and exceeds a side wall M21 of the second metal bump M2. In addition, the third insulating layer 15 may also extend along the first direction X and exceeds a side wall M21 of the second metal bump M2. Herein, the term "first direction" refers to a direction perpendicular to the normal direction Z of the electronic device.

In addition, as shown in FIG. 4B, the electronic device of the present disclosure may further comprise a fourth insulating layer 19 disposed on the third insulating layer 15, wherein a portion of the fourth insulating layer 19 extends and is disposed in the second opening H2 to contact the second metal bump M2. Herein, the material of the fourth insulating layer 19 may be similar to the material of the first insulating layer 11 and is not described again. According to some embodiments of the present disclosure, the thickness T3 of the fourth insulating layer 19 may be, for example, greater than or equal to 8 µm and less than or equal to 30 µm; that is, the thickness T3 of the fourth insulating layer 19 may be different from the thickness T1 of the first insulating layer 11. Through the above design, for example, the warpage of the electronic device can be improved; but the present disclosure is not limited thereto. In the present disclosure, "the thickness T3 of the fourth insulating layer 19" refers to the maximum thickness from the bottom surface 191 of the fourth insulating layer 19 to the upper surface 192 of the fourth insulating layer 19 in the normal direction Z of the electronic device.

Figure 5A:
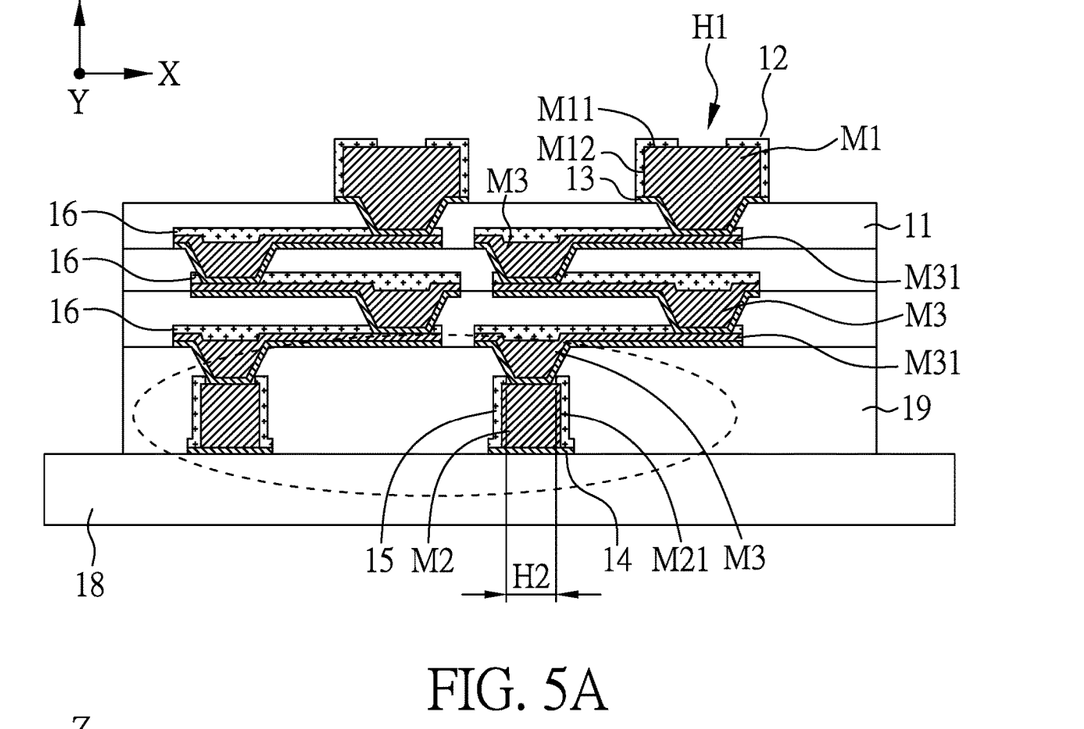
FIG. 5A is a schematic cross-sectional view of an electronic device according to one embodiment of the present disclosure.
Figure 5B:
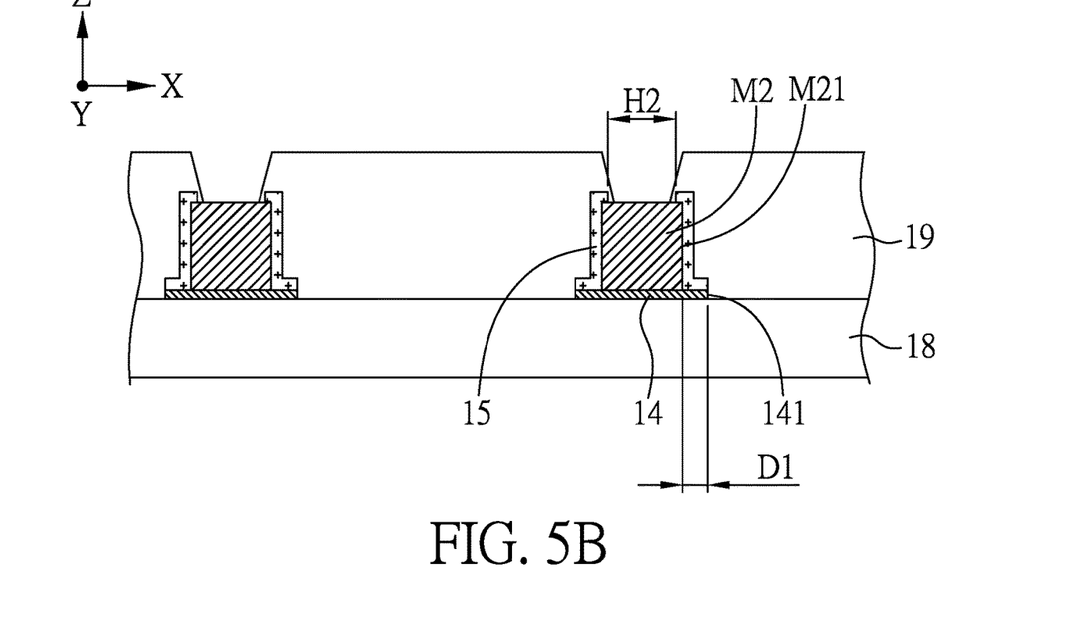
FIG. 5B is a partial enlarged view of FIG. 5A.

FIG. 5A is a schematic cross-sectional view of an electronic device according to one embodiment of the present disclosure. FIG. 5B is a partial enlarged view of FIG. 5A. The electronic device shown in FIG. 5A is similar to that shown in FIG. 4A, except for the following differences.

As shown in FIG. 5A and FIG. 5B, the third metal layer 14 is disposed on the substrate 18, wherein the third metal layer 14 extends along a first direction X, and the third metal layer 14 and the second metal bump M2 or the third insulating layer 15 are overlapped in the normal direction Z of the electronic device. More specifically, in the first direction X, the third metal layer 14 extends and exceeds a side wall M21 of the second metal bump M2, and a distance D1 between the side wall M21 of the second metal bump M2 and an edge 141 of the third metal layer 14 is in a range from 1 µm to 10 µm.

Figure 5C:
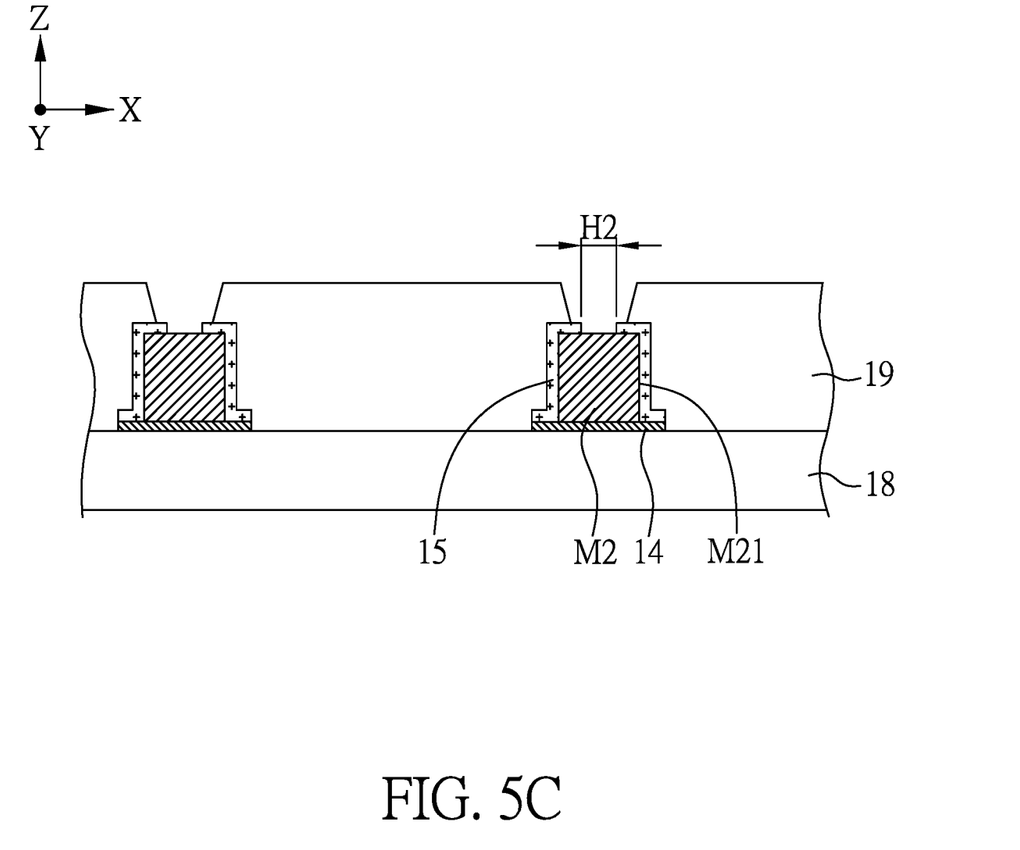
FIG. 5C is a partial enlarged view of FIG. 5A in another aspect.

FIG. 5C is a partial enlarged view of FIG. 5A in another aspect. FIG. 5C is similar to FIG. 5B, except for the following differences. As shown in FIG. 5C, the fourth insulating layer 19 is disposed on the third insulating layer 15, wherein the fourth insulating layer 19 is not disposed in the second opening H2 and does not contact the second metal bump M2. When the adhesion between the material of the fourth insulating layer 19 and the second metal bump M2 is poor, this design can improve the reliability of the obtained electronic device.

FIG. 6A to FIG. 6G are schematic cross-sectional views showing a method for manufacturing an electronic device according to one embodiment of the present disclosure.

Figure 6A:
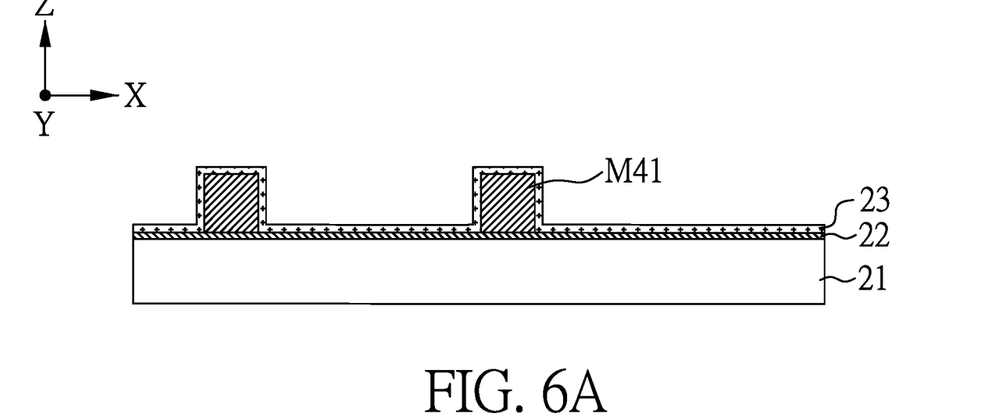
FIG. 6A to FIG. 6G are schematic cross-sectional views showing a method for manufacturing an electronic device according to one embodiment of the present disclosure.

As shown in FIG. 6A, a substrate 21 is provided. Then, a metal layer 22 is formed on the substrate 21. In one embodiment of the present disclosure, even not shown in the figure, if the subsequent process includes the step of removing the substrate 21, the process may further comprise a step of forming a release layer on the substrate 21 prior to the step of forming the metal layer 22 on the substrate 21. Herein, the release layer may comprise an adhesive, an epoxy resin, a die attach film (DAF) or the like, but the present disclosure is not limited thereto. The release layer can facilitate the subsequent step of removing the substrate 21. Then, a metal bump M41 is formed on the metal layer 22, followed by forming an insulating layer 23 on the metal bump M41 and the metal layer 22.

Figure 6B:
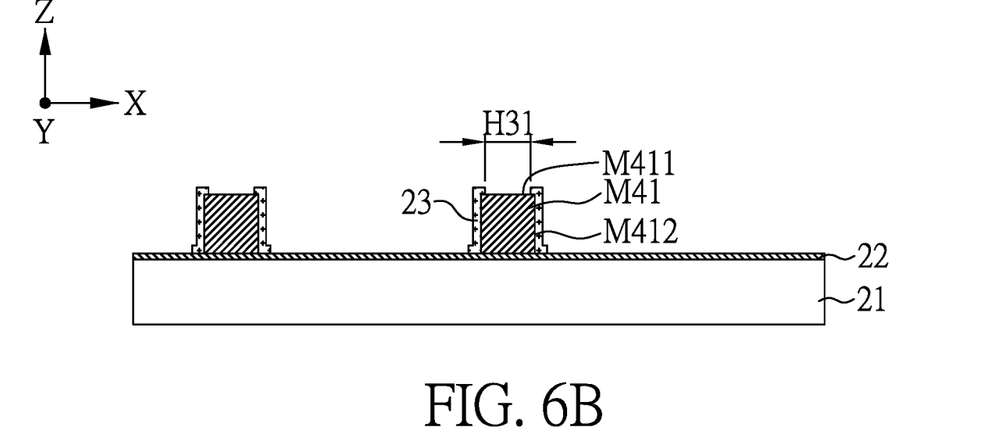

As shown in FIG. 6B, the insulating layer 23 is patterned to form an opening H31 to expose a portion of the metal bump M41 and a portion of the metal layer 22. Herein, the insulating layer 23 may cover a portion of a surface M411 of the metal bump M41 and a side wall M412 of the metal bump M41 to achieve the effect of protecting the metal bump M41 in the subsequent process, and thereby the electrical property or the reliability of the electronic device can be improved. For example, the design of the insulating layer 23 may protect the metal bump M41 to prevent the metal bump M41 from being scratched or eroded during the electroplating process, etching process, laser process or other electronic device manufacturing processes. The scratching or erosion of the metal bump M41 may increase the roughness thereof, thereby affecting the electrical property or reliability of the electronic device.

Figure 6C:
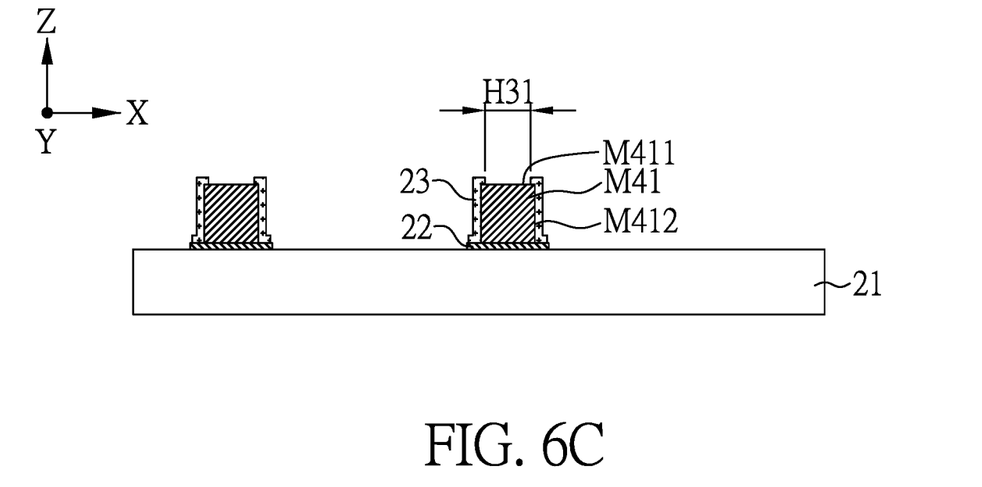

Then, the metal layer 22 is patterned to form the structure shown in FIG. 6C. In some embodiments of the present disclosure, the steps of patterning the insulating layer 23 and patterning the metal layer 22 may be omitted, and the obtained electronic device may be, for example, shown in FIG. 4A. Because the steps of patterning the insulating layer 23 and patterning the metal layer 22 may be omitted, in FIG. 4A, the third metal layer 14 and the third insulating layer 15 may extend along the first direction X and exceed the side wall M21 of the second metal bump M2.

Figure 6D:
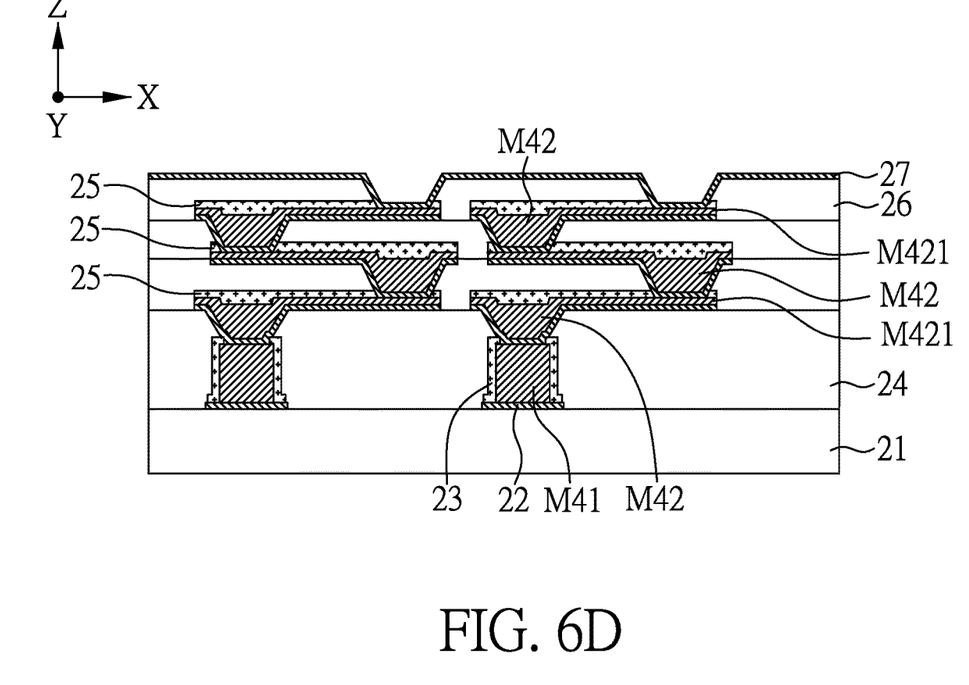

As shown in FIG. 6D, an insulating layer 24 is formed on the insulating layer 23. In the present disclosure, similar to the fourth insulating layer 19 shown in FIG. 5B, the insulating layer 24 may extend and be disposed in the opening H31 (as shown in FIG. 6C) to contact the metal bump M41. Or, similar to the fourth insulating layer 19 shown in FIG. 5C, the insulating layer 24 may be disposed on the insulating layer 23, but is not disposed in the opening H31 (as shown in FIG. 6C) and does not contact the metal bump M41.

Then, the aforesaid steps may be selectively repeated to form a plurality of metal bumps M42 on the substrate 21, wherein one of the plurality of metal bumps M42 may electrically connect to the metal bump M41. In addition, while forming the plurality of metal bumps M42, the extension portions M421 connecting to the plurality of metal bumps M42 may also be formed, and the plurality of metal bumps M42 electrically connect to each other through the extension portions M421. In the present disclosure, an insulating layer 25 may be formed on one of the plurality of metal bumps M42 or the extension portion M421 connecting to the one of the plurality of metal bumps M42. The insulating layer 25 may direct contact the one of the plurality of metal bumps M42 or the extension portion M421 connecting to the one of the plurality of metal bumps M42, and partially cover the surface of the one of the plurality of metal bumps M42 or the surface of the extension portion M421 connecting to the one of the plurality of metal bumps M42. In the present disclosure, the insulating layer 25 may cover the surface of the metal bump M42 and partially cover the surface of the extension portion M421 connecting to the metal bump M42. Thus, the insulating layer 25 can protect the surfaces of the plurality of metal bumps M42 to prevent the damage to the surface of the plurality of the metal bumps M42. Then, as shown in FIG. 6D, an insulating layer 26 is formed on the substrate 21, followed by forming a metal layer 27 on the insulating layer 26.

Figure 6E:
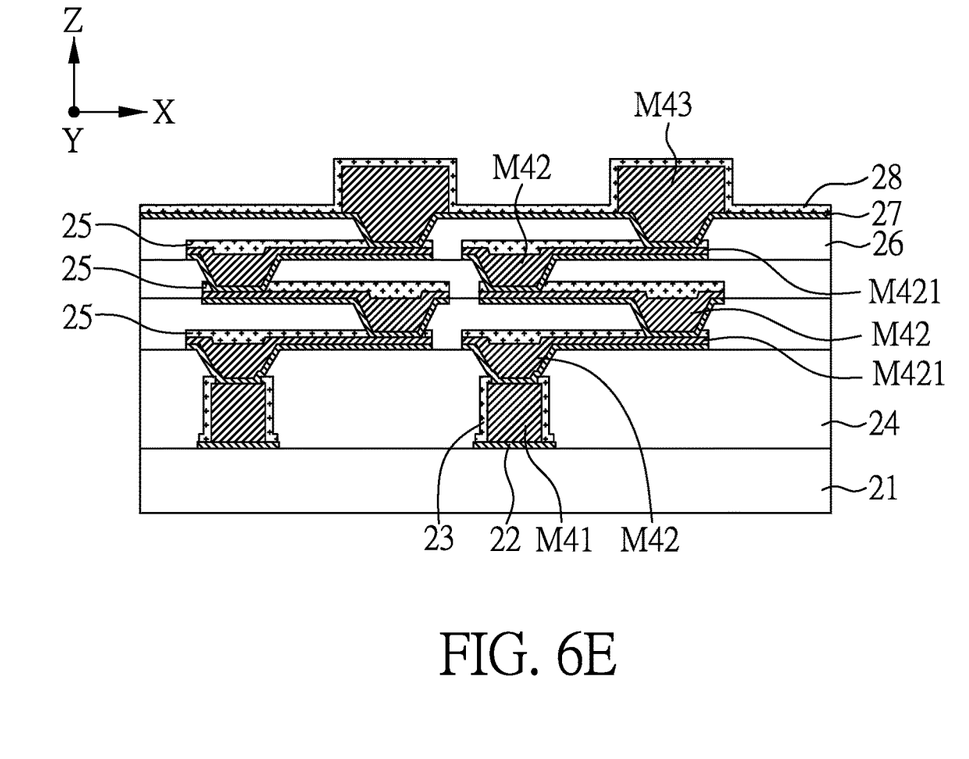

Then, as shown in FIG. 6E, a metal bump M43 is formed on the metal layer 27, wherein the metal bump M43 may electrically connect to one of the plurality of metal bumps M42. More specifically, the metal bump M43 may electrically connect to the extension portion M421 connecting the one of the plurality of metal bumps M42 through the metal layer 27. Then, as shown in FIG. 6E, an insulating layer 28 is formed on the metal bump M43 and the metal layer 27. Herein, the thickness of the insulating layer 28 may be less than the thickness of the insulating layer 26. In addition, even not shown in the figure, in another aspect of the present disclosure, before the step of forming the insulating layer 28 on the metal bump M43 and the metal layer 27, the process may further comprise a step of patterning the metal layer 27. Thus, the subsequent formed insulating layer 28 may contact the side wall of the metal layer 27 to form the electronic device, for example, shown in FIG. 1C.

Figure 6F:
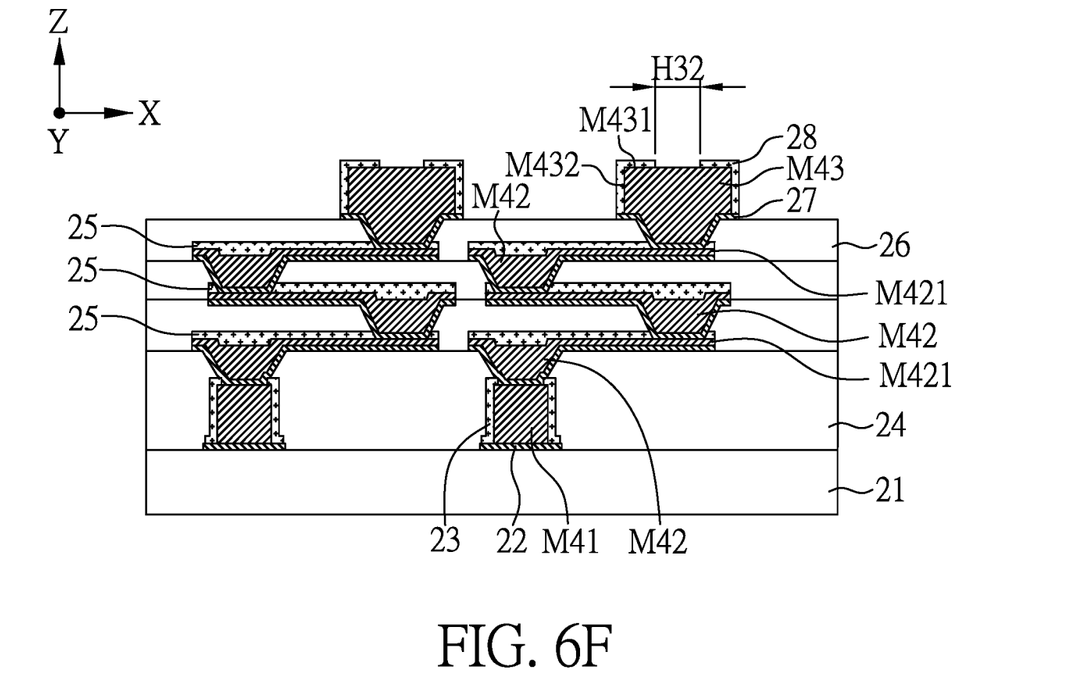

Then, as shown in FIG. 6F, the insulating layer 28 is patterned to form an opening H32 to expose a portion of the metal bump M43, and the metal layer 27 is patterned to form the electronic device shown in FIG. 5A. Herein, the insulating layer 28 may cover a portion of the surface M431 of the metal bump M43, and a side wall M432 of the metal bump M43. Thus, the insulating layer 28 may protect the metal bump M43 during the step of patterning the metal layer 27 to improve the electrical property of the obtained electronic device.

Figure 6G:
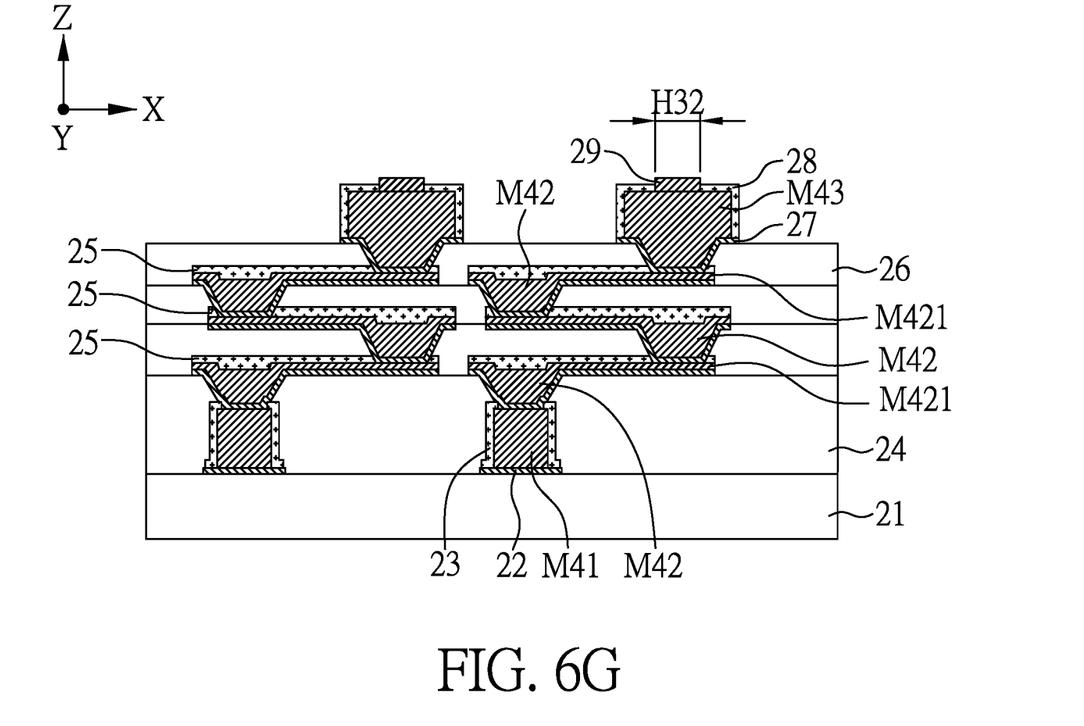

In the manufacturing process of one embodiment of the present disclosure, as shown in FIG. 6G, the process may selectively comprise a step of forming a metal layer 29 in the opening H32 to form an electronic device shown in FIG. 3. In addition, even not shown in the figure, in the manufacturing process of one embodiment of the present disclosure, the process may further comprise a step of removing the substrate 21 to form the electronic device, for example, as shown in FIG. 1A. Furthermore, even not shown in the figure, in the manufacturing process of another embodiment of the present disclosure, the process may further comprise a step of disposing an electronic unit on the insulating layer 28 and the metal layer 29; and a step of removing the substrate 21 to form the electronic device, for example, as shown in FIG. 2, wherein the electronic unit can electrically connect to the metal bump M43 through the metal layer 29 disposed in the opening H32.

In the present disclosure, the methods for forming the metal layers 22, 27, 29 and the metal bumps M41, M42, M43 are not particularly limited. For example, the metal layers 22, 27, 29 and the metal bumps M41, M42, M43 may be formed by sputtering, electroplating, chemical plating, chemical vapor deposition, or a combination thereof; but the present disclosure is not limited thereto. In addition, different metal layers 22, 27, 29 and/or different metal bumps M41, M42, M43 may be prepared by the same or different methods. In the present disclosure, the materials of the metal layers 22, 27, 29 and the metal bumps M41, M42, M43 are not particularly limited and may be, for example, gold, silver, copper, palladium, platinum, ruthenium, aluminum, cobalt, nickel, titanium, molybdenum, manganese, zinc, an alloy thereof or a combination thereof, but the present disclosure is not limited thereto. In addition, the metal layers 22, 27, 29 and the metal bumps M41, M42, M43 may be prepared by the same or different materials.

In the present disclosure, the methods for forming the insulating layers 23, 24, 25, 26, 28 are not particularly limited. For example, the insulating layers 23, 24, 25, 26, 28 may be prepared by dip coating, spin coating, roller coating, blade coating, spray coating, deposition or a combination thereof, but the present disclosure is not limited thereto. In addition, the insulating layers 23, 24, 25, 26, 28 may be prepared by the same or different methods. In the present disclosure, the materials of the insulating layers 23, 24, 25, 26, 28 are not particularly limited and may be, for example, an organic material, an inorganic material or a combination thereof. Examples of the suitable organic material include, polyimide (PI), photosensitive PI (PSPI), epoxy resin, polybenzoxazole (PBO), benzocyclobutene (ECB), photoresist, polymer or a combination thereof, but the present disclosure is not limited thereto. Examples of the suitable inorganic material include, silicon nitride, silicon oxide, silicon oxynitride, silicon carbonitride or a combination thereof, but the present disclosure is not limited thereto. In one embodiment of the present disclosure, the materials of the insulating layers 23, 25, 28 may be different from the materials of the insulating layers 24, 26 to prevent the warpage of the obtained electronic device. In one embodiment of the present disclosure, the materials of the insulating layers 23, 25, 28 may include an inorganic material, and the materials of the insulating layers 24, 26 may include an organic material; but the present disclosure is not limited thereto.

In the present disclosure, the insulating layers 23, 24, 25, 26, 28 may be prepared by a lithography process, but the present disclosure is not limited thereto. In addition, a portion of the metal layers 22, 27 may be removed by an etching process, which may include wet etching, dry etching or a combination thereof; but the present disclosure is not limited thereto.

In conclusion, in the present disclosure, the insulating layer is formed on the metal bump to protect the metal bump in the subsequent process, so the electrical property or reliability of the obtained electronic device can be improved.

In the present disclosure, the electronic device may be, for example, an electronic device comprising a re-distribution layer, a package component such as a fan-out panel level package (FOPLP) component, or a 2.5D package component; but the present disclosure is not limited thereto. In addition, the electronic device may include a display device, an antenna device, a sensing device, or a tiled device, but the present disclosure is not limited thereto. Herein, the method for forming the FOPLP component may include a redistribution layer first process or a chip first process.

Although the present disclosure has been explained in relation to its embodiment, it is to be understood that many other possible modifications and variations can be made without departing from the spirit and scope of the disclosure as hereinafter claimed.

What is claimed is:

1. An electronic device, comprising:
a first insulating layer;
a first metal bump disposed on the first insulating layer;
a second insulating layer disposed on the first metal bump, wherein the second insulating layer comprises a first opening exposing a portion of the first metal bump;
a third metal layer disposed under the first insulating layer;
a second metal bump disposed on the third metal layer, wherein the second metal bump electrically connects to the first metal bump;
a third insulating layer disposed on the second metal bump, wherein the third insulating layer comprises a second opening exposing a portion of the second metal bump; and
a fourth insulating layer disposed on the third insulating layer, wherein a portion of the fourth insulating layer extends and is disposed in the second opening to contact the second metal bump,
wherein a thickness of the first insulating layer is greater than a thickness of the second insulating layer,
wherein the first metal bump is disposed between the first insulating layer and the second insulating layer.

2. The electronic device of claim 1, wherein a material of the first insulating layer is different from a material of the second insulating layer.

3. The electronic device of claim 2, wherein the material of the first insulating layer comprises an organic material, and the material of the second insulating layer comprises an inorganic material.

4. The electronic device of claim 1, further comprising an electronic unit disposed on the second insulating layer, wherein the electronic unit electrically connects to the first metal bump.

5. The electronic device of claim 1, wherein the second insulating layer covers a side wall of the first metal bump.

6. The electronic device of claim 1, further comprising a first metal layer disposed between the first insulating layer and the first metal bump.

7. The electronic device of claim 1, further comprising a second metal layer disposed on the first metal bump and in the first opening of the second insulating layer.

8. The electronic device of claim 1, further comprising a plurality of third metal bumps disposed between the first metal bump and the second metal bump, wherein the first metal bump electrically connects to the second metal bump through the plurality of third metal bumps.

9. The electronic device of claim 1, wherein a thickness of the fourth insulating layer is different from the thickness of the first insulating layer.

10. The electronic device of claim 1, further comprising a substrate disposed under the first insulating layer.

11. A method for manufacturing an electronic device, comprising the following steps:
providing a substrate;
forming a third metal layer on the substrate;
forming a second metal bump on the third metal layer;
forming a third insulating layer on the second metal bump, wherein the third insulating layer comprises a second opening exposing a portion of the second metal bump;
forming a fourth insulating layer on the third insulating layer, wherein a portion of the fourth insulating layer extends and is disposed in the second opening to contact the second metal bump;
forming a first insulating layer on the substrate, wherein the third metal layer is disposed under the first insulating layer;
forming a first metal bump on the first insulating layer, wherein the second metal bump electrically connects to the first metal bump; and
forming a second insulating layer on the first metal bump, wherein the second insulating layer comprises a first opening exposing a portion of the first metal bump,
wherein a thickness of the first insulating layer is greater than a thickness of the second insulating layer,
wherein the first metal bump is disposed between the first insulating layer and the second insulating layer.

12. The method of claim 11, wherein a material of the first insulating layer is different from a material of the second insulating layer.

13. The method of claim 11, further comprising a step of disposing an electronic unit on the second insulating layer after the step of forming the second insulating layer on the first metal bump, wherein the electronic unit electrically connects to the first metal bump.

14. The method of claim 11, wherein the second insulating layer covers a side wall of the first metal bump.

15. The method of claim 11, further comprising a step of forming a first metal layer on the first insulating layer before the step of forming the first metal bump on the first insulating layer.

16. The method of claim 11, further comprising a step of forming a second metal layer on the first metal bump and in the first opening of the second insulating layer after the step of forming the second insulating layer on the first metal bump.

17. The method of claim 11, further comprising a step of removing the substrate after the step of forming the second insulating layer on the first metal bump.

* * * * *